United States Patent
Maruyama

(10) Patent No.: US 7,420,231 B2
(45) Date of Patent: Sep. 2, 2008

(54) SOLID STATE IMAGING PICK-UP DEVICE AND METHOD OF MANUFACTURING THE SAME

(75) Inventor: Yasushi Maruyama, Kanagawa (JP)

(73) Assignee: Sony Corporation (JP)

( * ) Notice: Subject to any disclaimer, the term of this patent is extended or adjusted under 35 U.S.C. 154(b) by 295 days.

(21) Appl. No.: 10/527,743

(22) PCT Filed: Sep. 18, 2003

(86) PCT No.: PCT/JP03/11922

§ 371 (c)(1),
(2), (4) Date: Mar. 14, 2005

(87) PCT Pub. No.: WO2004/027875

PCT Pub. Date: Apr. 1, 2004

(65) Prior Publication Data

US 2006/0006438 A1    Jan. 12, 2006

(30) Foreign Application Priority Data

Sep. 20, 2002    (JP)  ............... 2002-274557

(51) Int. Cl.
*H01L 27/148*    (2006.01)

(52) U.S. Cl. ............... 257/233; 257/291; 257/E27.133; 257/E27.15

(58) Field of Classification Search ............ 438/48, 438/57, 59, 60, 69, 73; 257/72, 222, 232–344, 257/428, 444, E31.075, E31.081, E31.084, 257/E27.154, E27.163, 59, E27.133, E27.141, 257/E27.15, 414, 440, 462

See application file for complete search history.

(56) References Cited

U.S. PATENT DOCUMENTS

4,694,185 A * 9/1987 Weiss ................... 250/208.1
5,371,397 A * 12/1994 Maegawa et al. ............ 257/432

(Continued)

FOREIGN PATENT DOCUMENTS

EP    1 107 316 A2    6/2001

(Continued)

OTHER PUBLICATIONS

International Search Report mailed Dec. 24, 2003.

*Primary Examiner*—Brook Kebede
(74) *Attorney, Agent, or Firm*—Rader Fishman & Grauer PLLC; Ronald P. Kananen

(57) ABSTRACT

A proper incident state can be obtained in each pixel in accordance with a distance between an optical system and a sensor photoreceptive portion, and improved photoreceptive efficiency and even sensitivity of pixels can be attempted.

Since a main light beam a launches on pixels in a screen peripheral part at an angle of incidence θ, a microlens (260), color filter (250), wires (220, 230 and 240), photodiode (110) and so on are disposed along the direction of incidence in accordance with the angle of incidence θ in a positional relationship. The angle of incidence θ here is determined in consideration of a distance from the microlens (260) to the surface of the silicon substrate (100) and a position in depth of the photoelectric converting portion of the photodiode (110) from the surface of the silicon substrate (100). The photoelectric converting portion (n-type region) of the photodiode (110) tilts in a pixel in the screen peripheral part in accordance with the angle of incidence θ.

12 Claims, 7 Drawing Sheets

U.S. PATENT DOCUMENTS 5,479,049 A * 12/1995 Aoki et al. ............... 257/642
6,211,509 B1 * 4/2001 Inoue et al. ............. 250/208.1
2005/0035376 A1 * 2/2005 Yamada ..................... 257/230

FOREIGN PATENT DOCUMENTS

| JP | 05-328233 | 12/1993 |
| JP | 06-339084 | 12/1994 |
| JP | 2000-349268 | 12/2000 |
| JP | 2001-160973 | 6/2001 |
| JP | 2001-210812 | 8/2001 |
| JP | 2001-237404 | 8/2001 |
| JP | 2003-078125 | 3/2003 |
| JP | 2003-273342 | 9/2003 |

* cited by examiner

SOLID STATE IMAGING PICK-UP DEVICE AND METHOD OF MANUFACTURING THE SAME

TECHNICAL FIELD

The present invention relates to a solid-state image pickup device, such as a CMOS image sensor and a CCD image sensor, and a method of manufacturing the same.

BACKGROUND ART

Hitherto, a solid-state image pickup device, such as a CMOS image sensor and a CCD image sensor, has had a construction including an imaging pixel unit having multiple pixels in a two-dimensional array form, for example, which are photoelectric converters (photodiodes), on a semiconductor substrate, a wiring layer in a multi-layer structure thereon, which has different signal wires and a light-shield film, and an on-chip color filter and/or an on-chip microlens thereon through a passivation layer.

Recently, in particular, with increases in the number of pixels (that is, high-density) and the functionality of the imaging pixel unit, the number of layers in the wiring layer and the complexity of a layout pattern thereof are increased. Because of an increase in the thickness thereof, a distance between an optical system, such as a color filter and a microlens, and a photodiode-receptive plane (called sensor photoreceptive portion, hereinafter) tends to increase.

Moreover, because of the microstructure due to an increase in the number of pixels of the imaging pixel unit, the lens form of the microlens tends to be minute.

However, as the distance between the photodiode and the microlens increases and/or the size of the microlens decreases, the angle of incidence of a main light beam differs in the center and peripheral parts of the screen of the imaging pixel unit, and the depth of the semiconductor substrate on which incident light is photoelectrically converted changes, which disadvantageously changes the amount of shading in accordance with the wavelength of the incident light. Since the amount of received light of the sensor photoreceptive portion differs in the center and peripheral parts of the screen, keeping even sensitivity therein may be difficult.

In particular, as the area for each pixel decreases and the size of the lens decreases, the angle of incidence of light on the peripheral part of the screen increases. On the other hand, in a pixel reduced in size, the form of the sensor photoreceptive portion becomes vertical and/or horizontal at the asymmetrical screen as described later, and the top and bottom and left and right ends of the screen may have uneven sensitivities.

Furthermore, in a CMOS image sensor having multiple wires such as a readout gate, a signal wire and a power-supply wire in an area near the photodiodes thereof, an effective pixel area becomes asymmetrical more easily, and the above-described problem becomes more significant.

In order to solve the problem, the sensitivity of the screen peripheral part is conventionally designed to increase by shifting a position of each lens and/or a position of an opening of the light-shield film in accordance with a position of a pixel thereof in the imaging pixel unit.

For example, FIG. 7 is a plan view showing a positional relationship among each pixel, the light-shield film opening part and collective lens in the imaging pixel unit of such a conventional solid-state image pickup device, and FIGS. 8A and 8B are explanatory diagrams illustrating decreases in sensitivity at the diagonal lines A-A' and B-B' of the imaging pixel unit shown in FIG. 7.

In FIG. 7, the light-shield film opening part and a collective lens 11 are placed in a pixel 10 in a center part of the screen at a position having the center agreeing with the center of the pixel 10 and are placed in a pixel 10 in the peripheral part of the screen at positions shifted in the direction of the incidence of light.

Furthermore, a readout gate portion 10B for reading out signal charges of a sensor photoreceptive portion 10A is provided at the lower left corner of the sensor photoreceptive portion 10A of each of the pixels 10.

Thus, the form of the sensor photoreceptive portion 10A of each of the pixels 10 is vertically and/or horizontally asymmetrical from the center of the screen due to the presence of the readout gate portion 10B, and the presence of the readout gate portion 10B more largely affects the asymmetry as the area of the pixel 10 decreases.

Therefore, even in a solid-state image pickup device having a light-shield film opening part and collective lens thereof at shifted positions, the asymmetry of each of the pixels 10 significantly decreases the sensitivity in the pixels 10 near the point A as shown in FIG. 8A, for example, and the sensitivity varies unevenly in the vertical and/or horizontal direction(s).

As a proposal for optimizing the amount of incident light on each pixel, one is known in which the positions of a lens, filter, light-shield film, sensor photoreceptive portion and so on are corrected in accordance with the distance from the center of an imaging area of each pixel and the height from a photoreceptive surface of the lens, as disclosed in JP-A-5-328233, JP-A-2000-349268, JP-A-2001-160973, JP-A-2001-210812 and so on. However, even with the proposal, effectively addressing the asymmetry of the sensor photoreceptive portion as described above is difficult. This may be because the position in the photoreceptive surface that the distance from the center of the imaging area to the photoreceptive portion covers is not studied and because the fact that light gathered by a lens launches on the surface of the photoreceptive portion is only considered though the positions of components in a pixel are corrected but the thickness in the direction of depth of a photoelectric converting portion in which photoelectric conversion actually occurs is not considered.

Accordingly, it is an object of the invention to provide a solid-state image pickup device and a method of manufacturing the same, which can obtain a proper incident state in each pixel and which can achieve an improvement in photoreceptive efficiency and even sensitivity in each pixel.

DISCLOSURE OF THE INVENTION

The invention is characterized by including an imaging area including multiple two-dimensionally arranged pixels, wherein the pixel has a collective lens and a photoelectric converting portion, the photoelectric converting portion has a surface in an asymmetrical form, the collective lens is positioned above the photoelectric converting portion and at a substantially symmetrical center making up for the surface asymmetry in a pixel in a center part of the imaging area, the collective lens is placed at a position shifted more toward the center of the imaging area from a part on the symmetrical substantial center as a distance from the center part of the imaging area to a pixel thereof increases, and the collective lens has an amount of shift depending on the degree of asymmetry of the surface of the photoelectric converting portion in a pixel positioned at an equal distance from the center of the imaging area.

The invention is characterized by including an imaging area including multiple two-dimensionally arranged pixels, wherein the pixel has a collective lens and a photoelectric converting portion, the collective lens is placed at a position shifted more toward the center of the imaging area as a distance from the center of the imaging area to a pixel thereof increases, and an amount of the shift of the collective lens is defined based on the height from a surface of the photoelectric converting portion of the collective lens and the thickness in the direction of depth of the substrate of the photoelectric converting portion such that an amount of light incident within the photoelectric converting portion can increase.

The invention is characterized by including an imaging area including multiple two-dimensionally arranged pixels, wherein the pixel has a photoelectric converting portion, and a bottom of the photoelectric converting portion is placed at a position shifted from the center of the imaging area toward the outside with respect to the surface thereof in each of at least some pixels of the multiple pixels.

The invention is an electronic apparatus having a solid-state image pickup device, the apparatus characterized in that the solid-state image pickup device has an imaging area including multiple two-dimensionally arranged pixels, wherein each pixel has a collective lens and a photoelectric converting portion, the collective lens is placed at a position shifted more toward the center of the imaging area as a distance from the center of the imaging area to a pixel thereof increases, an amount of the shift of the collective lens is defined based on the height from a surface of the photoelectric converting portion of the collective lens and the thickness in the direction of depth of the substrate of the photoelectric converting portion, and a bottom of the photoelectric converting portion is shifted from the center part of the imaging area toward the outside with respect to the surface thereof.

The invention is characterized by including a step of forming a photoelectric converting portion and a collective lens in each pixel of an imaging area, wherein the collective lens is placed at a position shifted more toward the center of the imaging area as a distance from the center of the imaging area to a pixel thereof increases, and an amount of the shift of the collective lens is defined based on the height from a surface of the photoelectric converting portion of the collective lens and the thickness in the direction of depth of the substrate of the photoelectric converting portion such that an amount of light incident within the photoelectric converting portion can increase.

BEST MODE FOR CARRYING OUT THE INVENTION

Embodiments of a solid-state image pickup device and method for manufacturing the same according to the invention will be described below.

Figure 1:
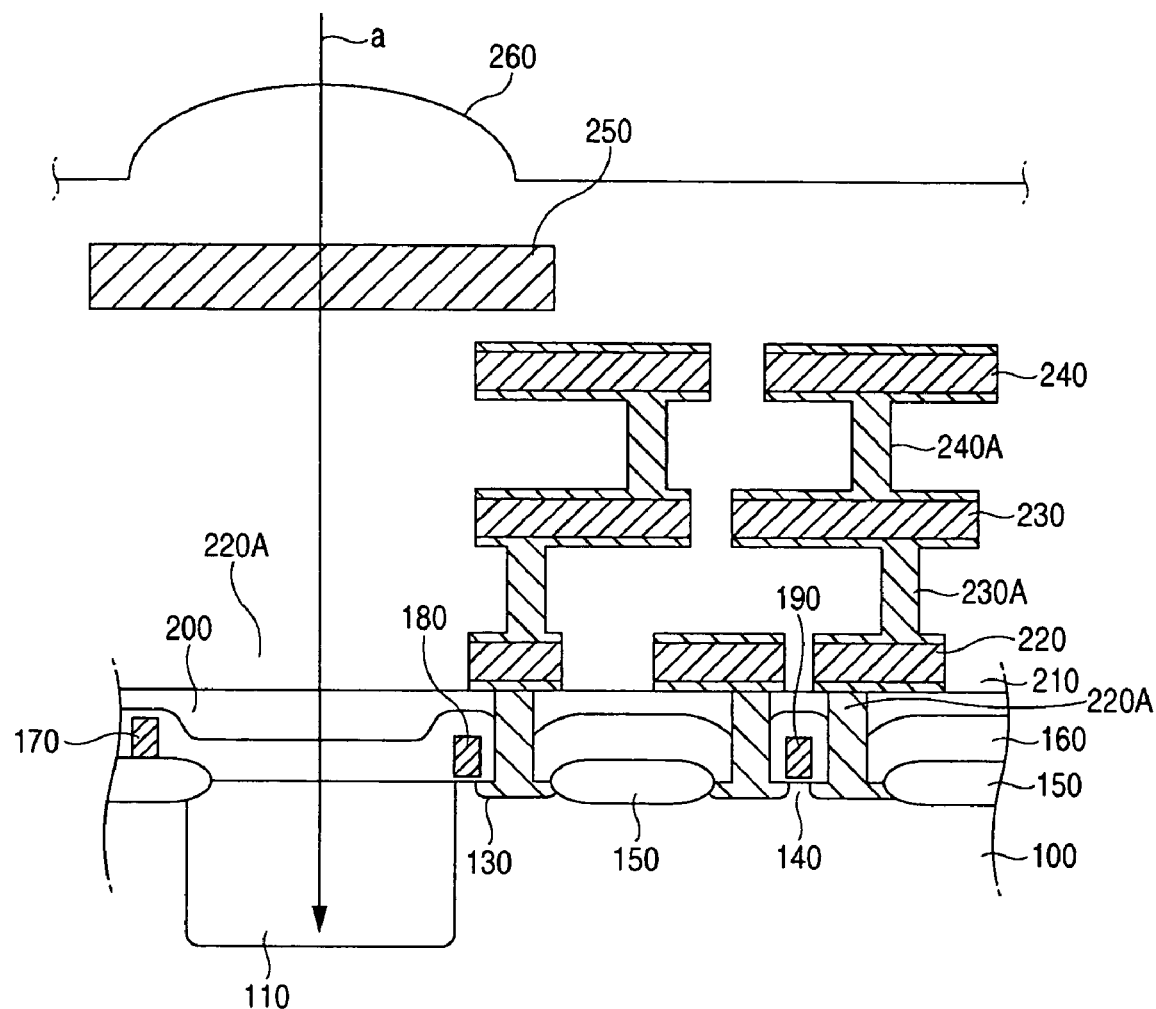
FIG. 1 is an enlarged sectional view showing a laminate structure of a pixel in a screen center part of a solid-state image pickup device according to an embodiment of the invention.
Figure 2:
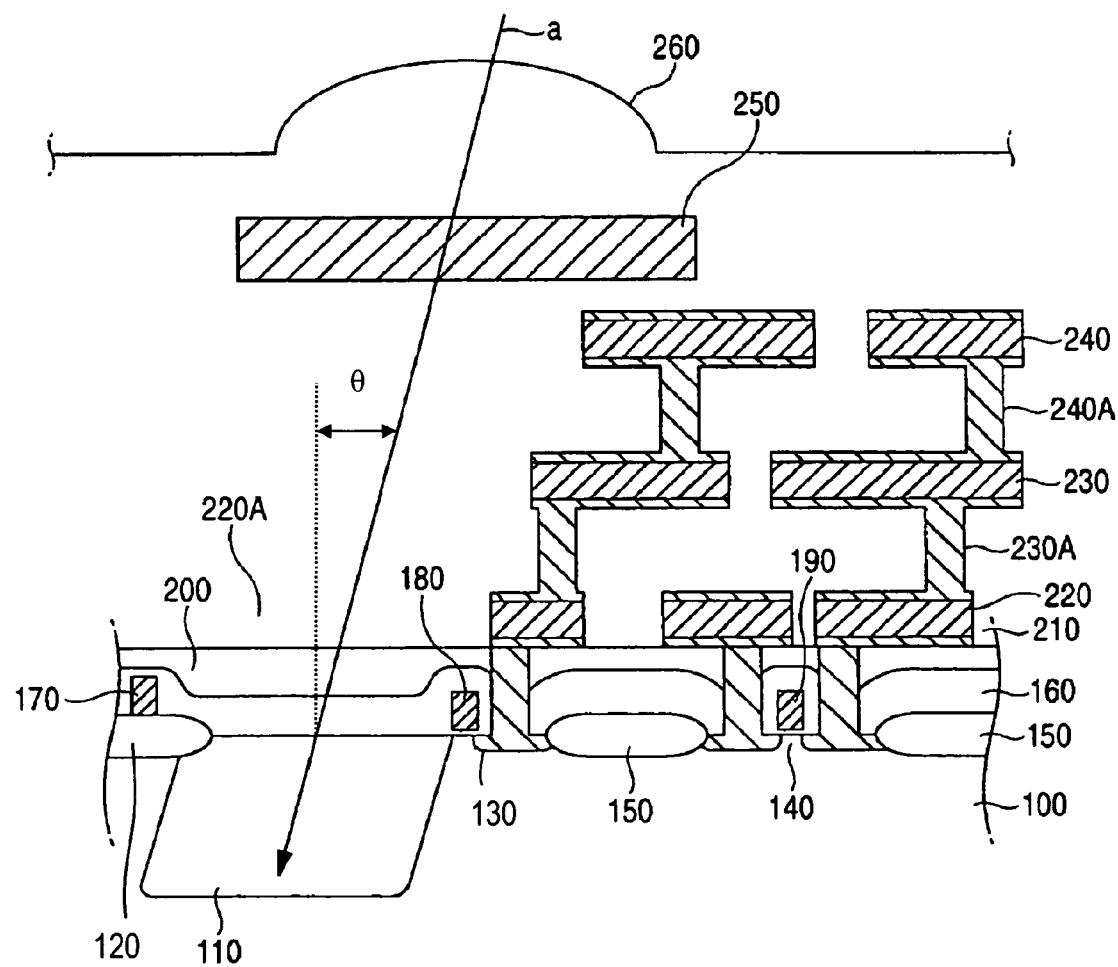
FIG. 2 is an enlarged sectional view showing a laminate structure of a pixel in a screen peripheral part of a solid-state image pickup device according to the embodiment of the invention.
Figure 3:
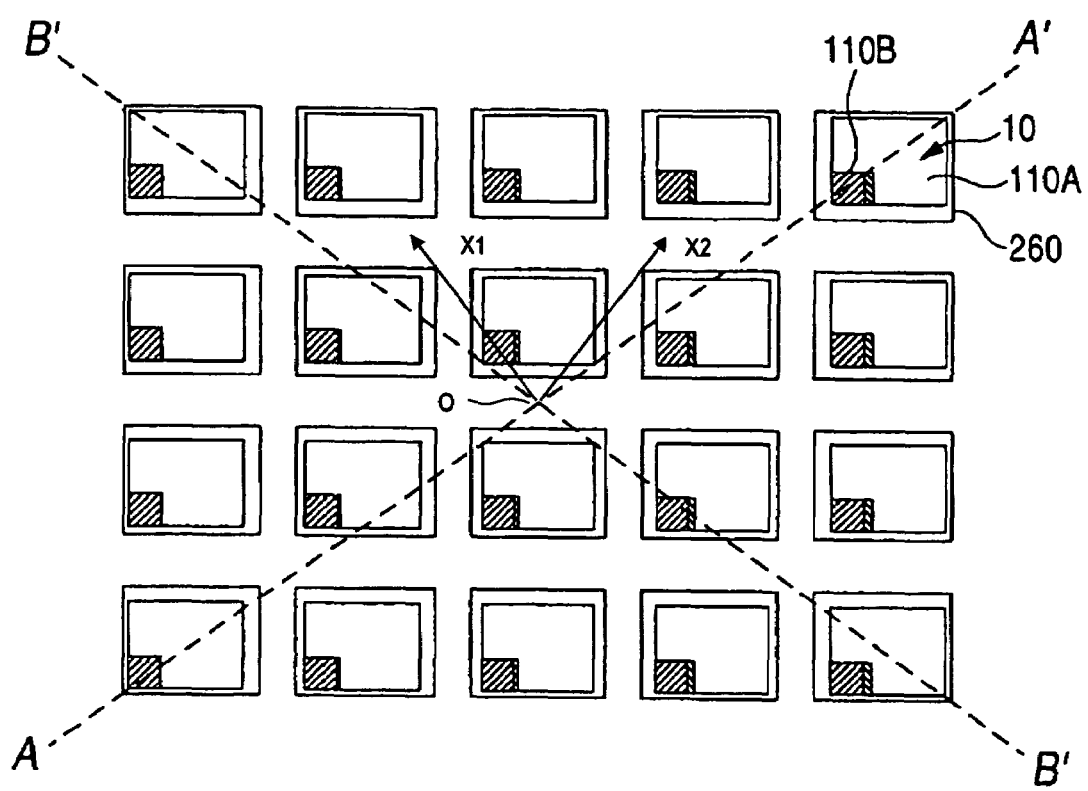
FIG. 3 is a plan view showing a positional relationship among each pixel, light-shield film opening part and collective lens in an imaging pixel unit of a solid-state image pickup device according to the embodiment of the invention.
Figure 4A:
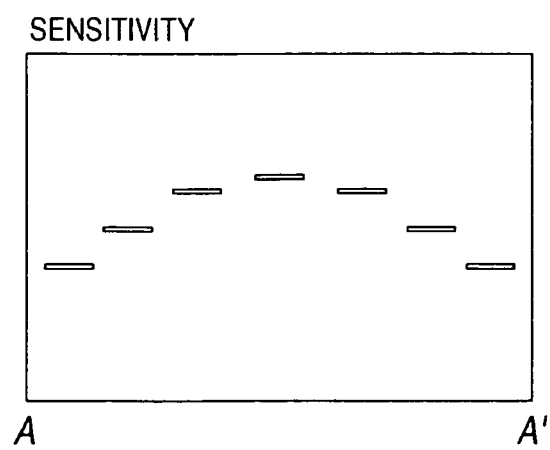
FIGS. 4A and 4B are explanatory diagrams illustrating decreases in sensitivity at the diagonal lines A-A' and B-B' of an imaging pixel unit shown in FIG. 3.
Figure 4B:
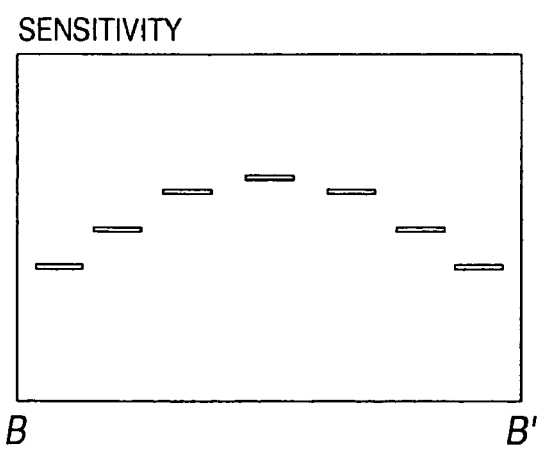

FIGS. 1 and 2 are enlarged sectional views showing a laminate structure of a solid-state image pickup device according to an embodiment of the invention. FIG. 1 shows a structure of a pixel in a screen center part, and FIG. 2 shows a structure of a pixel in a screen peripheral part;

FIG. 3 is a plan view showing a positional relationship among each pixel, light-shield film opening part and collective lens in an imaging pixel unit of a solid-state image pickup device according to the embodiment of the invention. FIGS. 4A and 4B are explanatory diagrams illustrating decreases in sensitivity at the diagonal lines A-A' and B-B' of the imaging pixel unit shown in FIG. 3.

A solid-state image pickup device according to this embodiment is provided as a CMOS image sensor, for example, and includes a photodiode (PD) serving as a photoelectric converter and a readout circuit for reading out signal charges generated by and integrated in the photodiode, converting the signal charges to electric signals and outputting the electric signals to the outside of the imaging pixel unit.

Among proposed readout circuits having various kinds of construction, the readout circuit herein has a transfer transistor for transferring signal charges generated in the photodiode, for example, to a floating diffusion (FD) portion, an amplifier transistor for converting a change in potential in the FD portion to an electric signal, a readout transistor for outputting a signal output from the amplifier transistor to an output signal line and a reset transistor for resetting the potential of the FD portion.

In FIGS. 1 and 2, a photodiode 110 for each pixel is provided on the top layer of a silicon substrate 100, and a transfer gate portion 120 and an FD portion 130 are provided adjacent to the photodiode 110. Other components including a transistor 140 are further provided therein. An inter-element separating layer 150 containing, for example, a LOCOS is provided on the top layer of the silicon substrate 100.

The photodiode 110 has p+ type regions on the outermost surface and in a pixel separating area of the silicon substrate 100 and n-type region inside, and photons having passed through the p+ type region launch on the n-type region so that positive holes and electrons can be separated, and electrons thereof can be integrated in a depletion layer serving as a bottom layer of the n-type region.

The photodiode 110 of this embodiment has an n-type region having a low concentration (or multiple layers of n-type regions having different impurity concentrations) at a deeper position of the silicon substrate 100 so that the depletion layer can be enlarged and an amount of integrated charges therefore can be increased in order to enhance the sensitivity.

The sensitivity of each pixel depends on the amount of incidence of light on the n-type region serving as a photoelectric converter in the photodiode 110, and the sensitivity of each pixel depends on the efficiency of incidence on the photoelectric converter.

Gate electrodes 170, 180 and 190 are provided on the silicon substrate 100 through an insulating film 160, such as a silicon oxide film. A wiring multilayer is provided on the insulating film 160 through a flattening film 200.

In the example shown, three layers of wires 220, 230 and 240 are provided in the wiring multilayer through an insulating film 210. The bottom wire 220 constructs a light-shield film and has an opening part 210A corresponding to the photodiode 110. Light (the main light beam of which is indicated by the arrow a) launches on the photodiode 110 through the opening part 210A.

The wires 220, 230 and 240 are connected to contacts 220A, 230A and 240A, each provided between the layers.

An on-chip color filter (optical filter) 250 is provided on the wiring multilayer through a passivation layer (not shown), and an on-chip microlens (collective lens) 260 is disposed thereon.

In the solid-state image pickup device according to this embodiment, since the main light beam a launches at a right angle on pixels in the screen center part shown in FIG. 1, the microlens 260, color filter 250, wires 220, 230 and 240, photodiode 110 and so on are disposed vertically (that is, the top-down direction of FIG. 1) straight in a positional relationship.

On the other hand, since the main light beam a launches on pixels in the screen peripheral part shown in FIG. 2 at an angle of incidence θ, the microlens 260, color filter 250, wires 220, 230 and 240, photodiode 110 and so on are disposed along the direction of incidence in accordance with the angle of incidence θ in a positional relationship so that the arrangement of these elements can be optimized.

In this embodiment, in particular, the angle of incidence θ on which the positional relationship among the elements depends is determined in consideration of the position of a pixel within a screen (that is, the distance from the center), the distance from the microlens 260 to the surface of the silicon substrate 100 (that is, the photoreceptive plane of the photodiode 110), and the position in depth of the photoelectric converting portion of the photodiode 110 from the surface of the silicon substrate 100.

In other words, the angle of incidence θ is defined not with respect to the substrate surface on which light launches but with respect to the position in depth of the photoelectric converting portion of the photodiode 110 so that light can be gathered substantially at a position where photoelectric conversion is performed and the photoreceptive efficiency (that is, sensitivity) of each pixel can be therefore enhanced.

The position in depth of the photoelectric converting portion used herein is indicated by a value depending on the depth of the n-type region of the photodiode 110.

Furthermore, as shown in FIG. 2, the photoelectric converting portion (n-type region) of the photodiode 110 tilts from the center part of the imaging area (imaging pixel portion) to the outside in a pixel in the screen peripheral part in accordance with the angle of incidence θ.

The photoelectric converting part of the photodiode 110 tilting in accordance with the angle of incidence θ in this way allows the main light beam launched with a tilt to launch on the photoelectric converting portion (n-type region) efficiently, which can enhance the photoreceptive efficiency (that is, the sensitivity) of pixels in the screen peripheral part.

Here, the tilting angles of the photoelectric converting portions may be even over the imaging area or may be increased as the distances from the center part of the imaging area to pixels increase.

Figure 5:
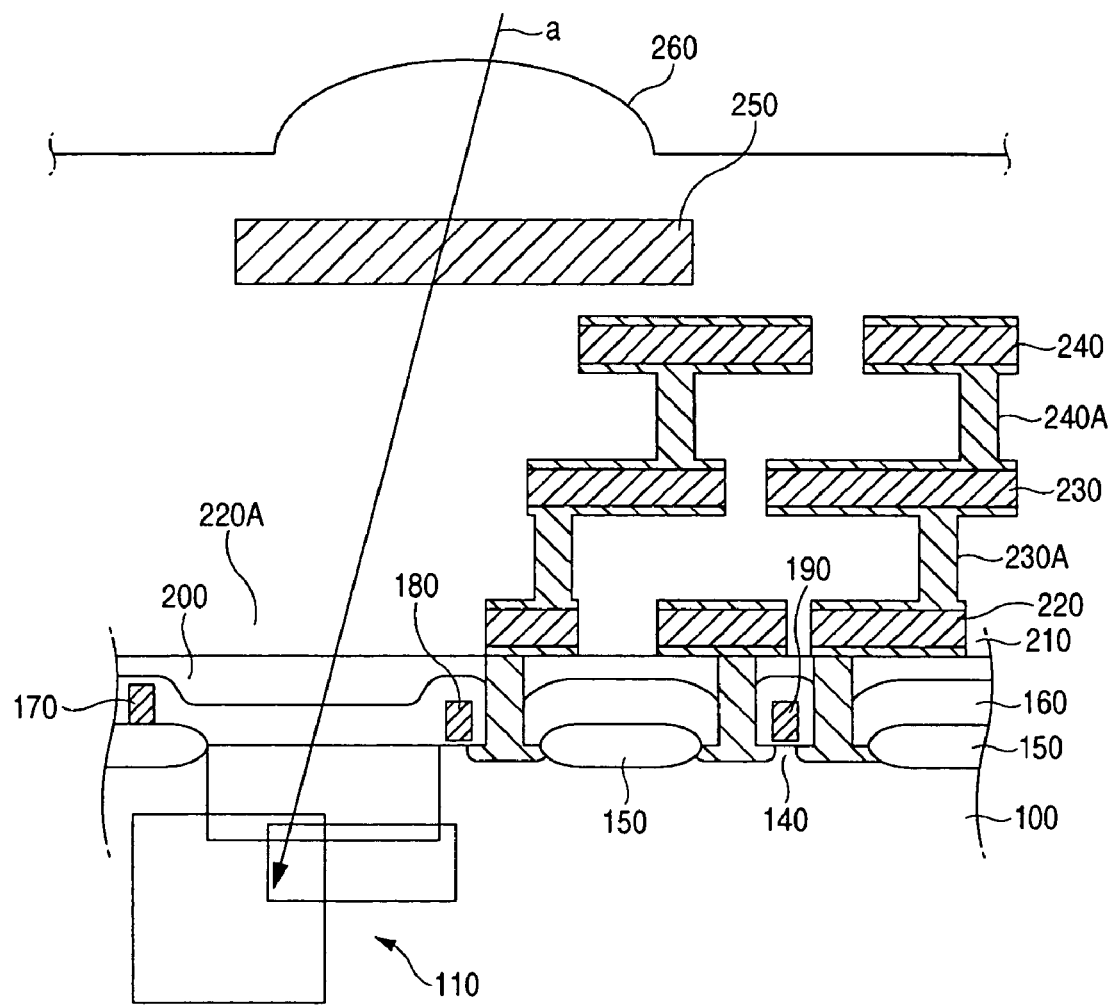
FIG. 5 is a diagram showing a variation example of a construction of a diode of the solid-state image pickup device according to the embodiment of the invention.

Furthermore, as shown in FIG. 5, the photoelectric converting portion may include multiple impurity regions.

Furthermore, as shown in FIG. 3, the sensor photoreceptive portion 110A of the photodiode 110 included in a pixel has a readout gate portion (transfer gate 120) 110B for reading out signal charges of the sensor photoreceptive portion 110A in the lower left corner and a rectangular form missing one corner.

Figure 7:
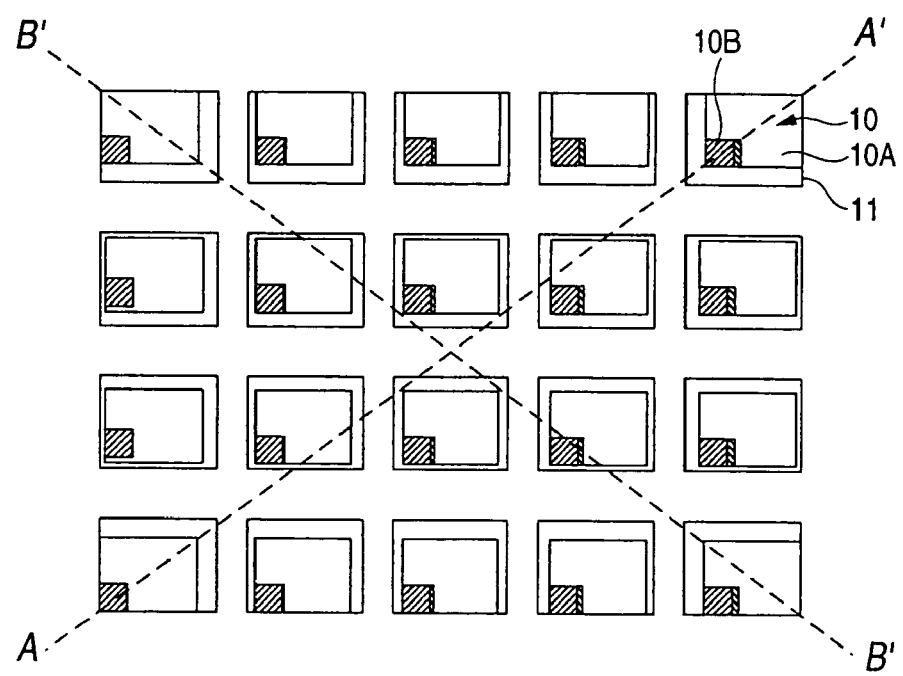
FIG. 7 is a plan view showing a positional relationship among each pixel, light-shield film opening part and collective lens in an imaging pixel unit of a conventional solid-state image pickup device.
Figure 8A:
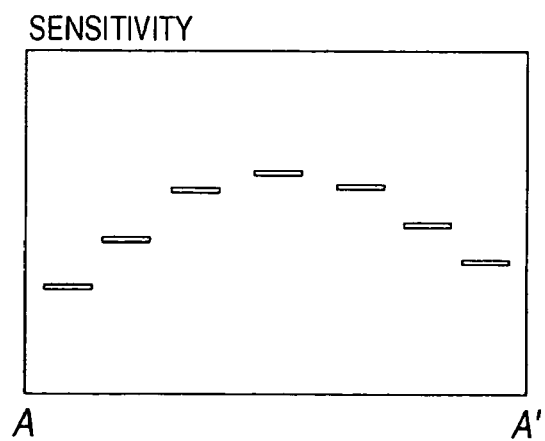
FIGS. 8A and 8B are explanatory diagrams showing decreases in sensitivity at the diagonal lines A-A' and B-B' of an imaging pixel unit shown in FIG. 7.
Figure 8B:
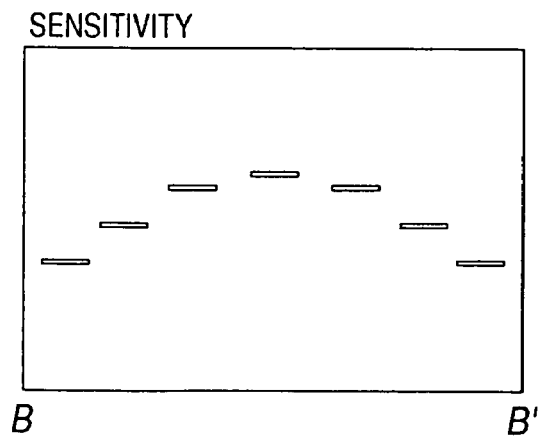

Thus, as described in the conventional example shown in FIG. 7, the form of each of the sensor photoreceptive portions 110A is vertically and horizontally asymmetrical due to the presence of the readout gate portion 110B, and the sensitivity of pixels in one corner of the screen (the lower left part of the screen (point A side of FIG. 3) in this case) in particular is lower than the sensitivity of pixels in the other corners.

Accordingly, in this embodiment, the microlens 260 and light-shield film opening part 210A in each of pixels on the point A side are placed at positions shifted toward the center of the imaging area more largely than those of pixels on the A', B and B' sides with respect to the conventional example shown in FIG. 7, so that the amount of a positional correction can be increased, and the amount of loss in received light due to the readout gate portion 110B of each of the pixels can be even in pixels in each of the corners.

As a result, the distribution of the sensitivity of the pixels varies evenly in the vertical and horizontal directions, as shown in FIGS. 4A and 4B, which can overcome the unevenness described with reference to the conventional example.

Here, the processing for increasing the amount of positional correction is preferably performed not only on pixels on the line on the point A side but also on pixels near the line on the point A side.

Furthermore, a solid-state image pickup device according to this embodiment can be formed by manufacturing steps as described below, for example.

First of all, for example, a p-type well region serving as a device-formed region is formed in the n-type silicon substrate 100, and the interelement separating layer 150 is also formed therein.

Then, devices such as the photodiode 110 and the transistor 140 are formed in the p-type well region by a technique such as ion-implantation and thermal diffusion while the n-type region of the photodiode 110 is formed in a different form for each pixel by performing ion implantation with different angles of implantation multiple times and by using multiple masking steps and performing ion-implantation multiple times.

Then, an electrode layer and/or a wiring multilayer are formed on the silicon substrate by using a film-forming technology and/or a lithography technology, and a color filter and a microlens are formed sequentially thereon. At that time, the light-shield film opening part, wires, color filter and microlens are formed at optimized positions in accordance with a positional relationship among the devices, which is determined in the above-described manner.

Thus, a solid-state image pickup device can be obtained which has an improved photoreceptive efficiency and a vertically and horizontally even distribution of sensitivity.

While, in the description above, the on-chip microlens 260 is used as a collective lens, the invention is not limited to this form. The on-chip microlens 260 may be an interlayer lens between wire layers or may be either a concave lens or a convex lens.

While the description above illustrates the example in which the positions of the on-chip lens, wires and light-shield film (the function of which is achieved by a wire) are corrected, and a photodiode tilted in accordance with the angle of incidence of the main light beam of incident light is provided, all components are not always required. For example, the on-chip lens may be disposed only at a corrected position, or a tilted photodiode only may be provided therein.

The correction of a position of a collective lens and so on is not always required for every pixel of an imaging area of the solid-state image pickup device but may be performed only on a predetermined pixel. Moreover, each pixel does not have to be a unit of the correction, and identical correction can be performed on several adjacent pixels as one unit.

While the description above illustrates the example in which the invention is applied to a CMOS image sensor, the invention can be also applied to other solid-state image pickup devices, such as a CCD image sensor. In particular, the invention is effective for one having a sensor photoreceptive portion in a vertically and/or horizontally asymmetrical form as described above.

Figure 6:
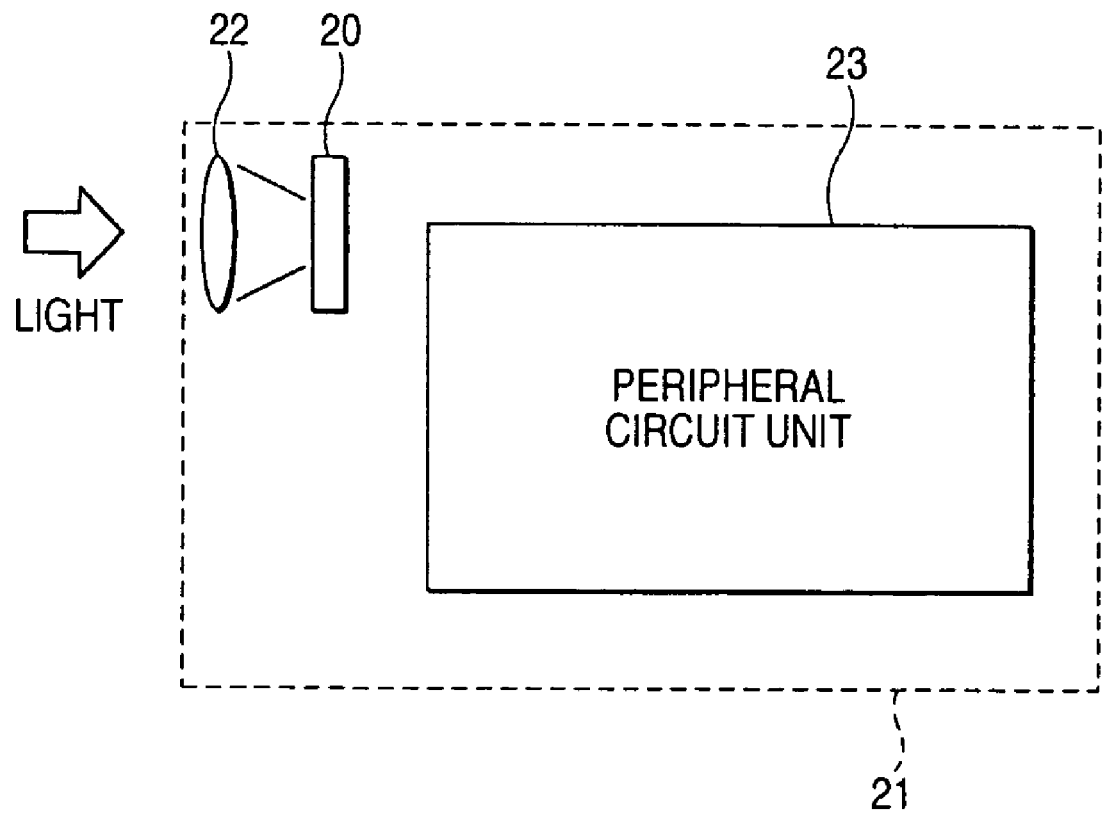
FIG. 6 is a diagram showing an electronic apparatus according to the embodiment of the invention.

While the description above illustrates the example in which the invention is applied to a solid-state image pickup device independently, the invention is applicable to different kinds of electronic apparatuses, such as a communication apparatus and image processor having the solid-state image pickup device 20, for example, as shown in FIG. 6. Here, the electronic apparatus 21 also includes a solid-state image pickup device module including the optical system 22 and/or a peripheral circuit unit 23.

In particular, since an exit pupil distance can be reduced by the above-described structure of the solid-state image pickup device, the size of a mobile apparatus having the solid-state image pickup device can be reduced. Thus, the added value of the mobile apparatus can be largely enhanced. Such a mobile apparatus is also included in the invention.

INDUSTRIAL APPLICABILITY

As described above, with a solid-state image pickup device and method of manufacturing the same according to the invention, positions of a collective lens (and a wire and a light-shield film opening part) in each pixel are defined based on the height from a surface of the photoelectric converting portion of the collective lens and the thickness in the depth direction of the substrate of the photoelectric converting portion such that an amount of light incident within the photoelectric converting portion can increase and the bottom of the photoelectric converting portion rather than the surface thereof is shifted to the outside with respect to the center part of an imaging area. Thus, a proper incident state can be obtained in each pixel, and an improved photoreceptive efficiency, and even sensitivity of each pixel, and the suppression of mixed color due to light reflected by a wiring layer thereof can be attempted. Therefore, a solid state image pickup device for improved image quality can be advantageously provided.

The invention claimed is:

1. A method of manufacturing a solid-state image pickup device, characterized by comprising:
   a step of forming a photoelectric converting portion and collective lens in each pixel of an imaging area,
   wherein the collective lens is placed at a position shifted more toward a center of the imaging area than the position of the photoelectric converting portion in a pixel based on a position of each pixel; and
   an amount of the shift of the collective lens is defined based on the height from a surface of the photoelectric converting portion of the collective lens and the thickness in the direction of depth of the substrate of the photoelectric converting portion such that an amount of light incident within the photoelectric converting portion can increase.

2. The method of manufacturing a solid-state image pickup device according to claim 1, characterized in that a bottom of the photoelectric converting portion is placed at a position shifted from the center part of the imaging area toward the outside with respect to the surface thereof.

3. The method of manufacturing a solid-state image pickup device according to claim 2, characterized in that an amount of the shift of the bottom of the photoelectric converting portion is increased as the distance from the center of the imaging area to a pixel thereof increases.

4. The method of manufacturing a solid-state image pickup device according to claim 3, characterized in that the photoelectric converting portion is formed by performing ion-implantation into a semiconductor layer multiple times.

5. The method of manufacturing a solid-state image pickup device according to claim 4, characterized in that the ion-implantation is performed multiple times at different angles of implantation.

6. A solid-state image pickup device comprising:
   pixels arranged in an imaging area, each of the pixels having a collective lens and a photoelectric converting portion,
   wherein the collective lens is placed at a position shifted more toward a center of the imaging area than the position of the photoelectric converting portion in a pixel based on a position of each pixel.

7. The solid-state image pickup device according to claim 6, wherein, as said configuration, the collective lens for said one of the pixels is shifted more toward a center of said imaging area than the collective lens for said another of the pixels.

8. The solid-state image pickup device according to claim 6, wherein, as said configuration, the collective lens for said one of the pixels is closer to the photoelectric converting portion than the photoelectric converting portion for said another of the pixels.

9. The solid-state image pickup device according to claim 6, wherein, as said configuration, the photoelectric converting portion for said one of the pixels tilts more from a center part of said imaging area to an outside in a pixel in the screen peripheral part than the photoelectric converting portion for said another of the pixels.

10. The solid-state image pickup device according to claim 6, wherein, as said configuration, a depth of the photoelectric converting portion for said one of the pixels is greater than a depth of the photoelectric converting portion for said another of the pixels.

11. The solid-state image pickup device according to claim 6, wherein, as said configuration, wires for said one of the pixels are shifted more toward a center of the imaging area wires for said another of the pixels.

12. The solid-state image pickup device according to claim 6, wherein the photoelectric converting portion includes multiple impurity regions.

* * * * *